(12) United States Patent
Aoki et al.

(10) Patent No.: US 6,336,989 B1
(45) Date of Patent: *Jan. 8, 2002

(54) MAGNETIC FIELD GENERATOR FOR MRI, METHOD FOR ASSEMBLING THE SAME, AND METHOD FOR ASSEMBLING A MAGNET UNIT FOR THE SAME

(75) Inventors: Masaaki Aoki, Takatsuki; Shigeo Hashimoto, Saga, both of (JP)

(73) Assignee: Sumitomo Special Metals Co., Ltd., Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/366,563

(22) Filed: Aug. 4, 1999

(30) Foreign Application Priority Data

Aug. 6, 1998 (JP) .......................................... 10-223444

(51) Int. Cl.[7] .......................... H01F 41/02; H01F 7/02; B32B 31/06

(52) U.S. Cl. .................... 156/275.7; 156/293; 156/297; 29/467; 29/468; 335/297; 335/306; 324/318

(58) Field of Search .............................. 156/275.7, 293, 156/297; 29/467, 468; 335/297, 301, 304, 306; 324/318, 319

(56) References Cited

U.S. PATENT DOCUMENTS

| | | | |
|---|---|---|---|
| 4,931,760 A | | 6/1990 | Yamaguchi et al. ......... 335/306 |
| 5,283,544 A | * | 2/1994 | Sakurai et al. ............... 335/297 |
| 5,621,324 A | | 4/1997 | Ota et al. ..................... 324/319 |
| 5,631,616 A | * | 5/1997 | Ohta et al. ................... 335/297 |

FOREIGN PATENT DOCUMENTS

| | | |
|---|---|---|
| EP | 0 591 542 A1 | 4/1994 |
| JP | 6-224029 | 8/1994 |
| JP | 2699250 | 9/1997 |

OTHER PUBLICATIONS

Patent Abstracts of Japan, vol. 015, No. 275 (C–0849), Jul. 12, 1991, & JP 03 094733 A (Sumitomo Special Metals Co Ltd.), Apr. 19, 1991—abstract.

Patent Abstracts of Japan, vol. 013, No. 238 (C–603), Jun. 5, 1989 & JP 01 049549 A (Sanyo Electric Co Ltd), Feb. 27, 1989—abstract.

Patent Abstract s of Japan, vol. 018, No. 590 (E–1628), Nov. 10, 1994 & JP 06 224029 A (Shin Etsu Chem Co Ltd.), Aug. 12, 1994—abstract.

(List continued on next page.)

Primary Examiner—Michael W. Ball
Assistant Examiner—Michael A. Tolin
(74) Attorney, Agent, or Firm—Armstrong, Westerman, Hattori, McLeland & Naughton, LLP.

(57) ABSTRACT

A plate yoke has an upper surface formed with a projection and a guiding rail. A new magnet block is transported by sliding on the upper surface of the plate yoke, and is bonded side by side with the projection or a magnet block which is already fixed. During the above operation, a magnetic member is held above the plate yoke. Preferably, the new magnet block is transported toward a corner portion, with side surfaces of the magnet block held parallel to a side surface of the projection and a side surface of the guiding rail respectively. When the magnet unit and the column yoke is connected, the column yoke or the magnet unit is lowered so that a guiding rod attached to an end face of the column yoke is inserted into a hole formed in the magnetic unit. Further, the column yoke is guided by a guiding member disposed between a permanent magnet on the plate yoke and a position where the column yoke is to be connected on the plate yoke.

11 Claims, 15 Drawing Sheets

OTHER PUBLICATIONS

Patent Abstracts of Japan; vol.012, No. 130 (E–603), Apr. 21, 1988 (Apr. 21, 1988) & JP 62 256416 A (Sumitomo Special Metals Co LTD), Nov. 9, 1987 (Nov. 09, 1987) *abstract*.

Patent Abstracts of Japan; vol. 017, No. 243 (C–1058), May 17, 1993 (May 17, 1993) & JP 04 371136 A (Hitachi Medical Corp), Dec. 24, 1992 (Dec. 24,1992).

* cited by examiner

F I G. 1
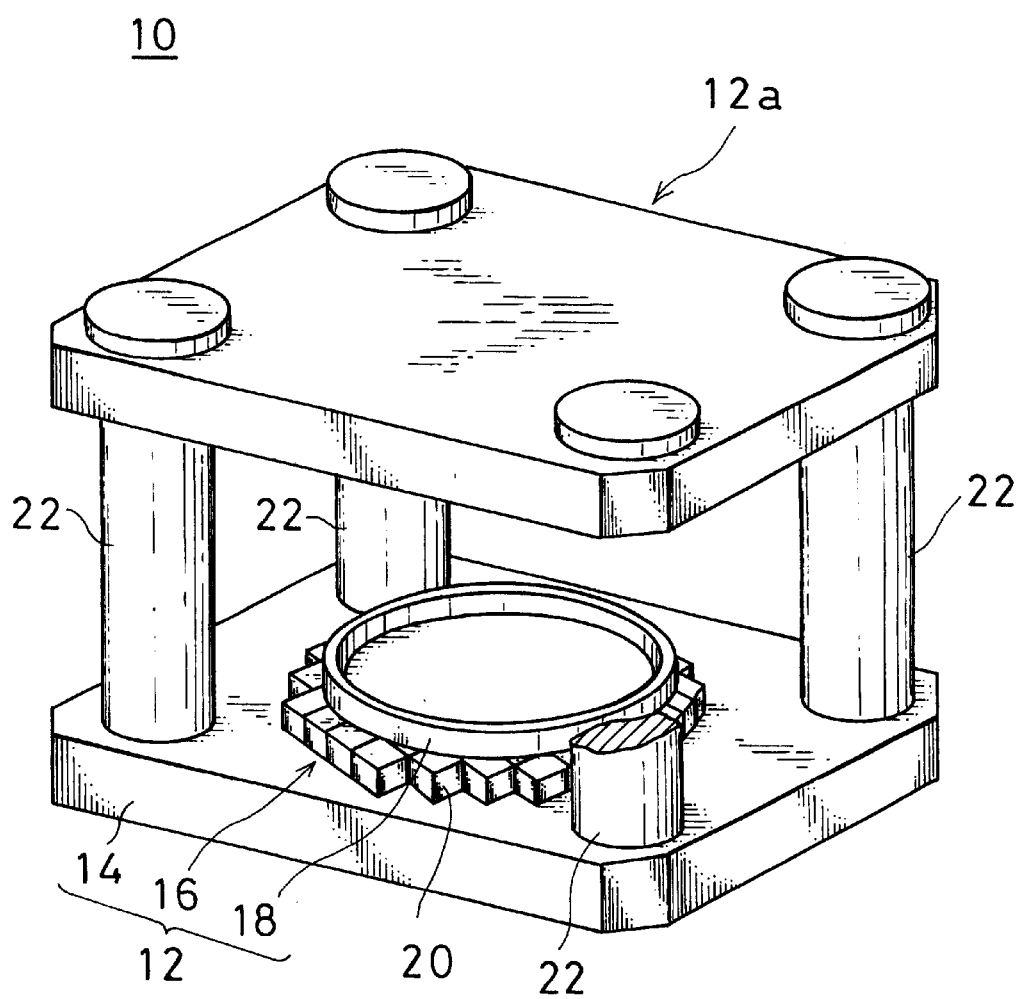

F I G. 2
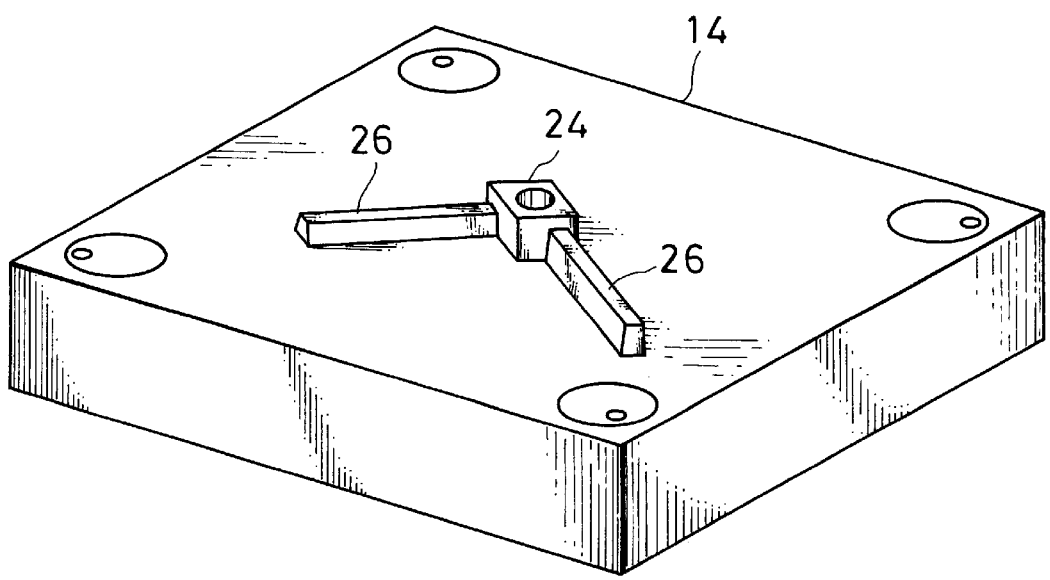

F I G. 10
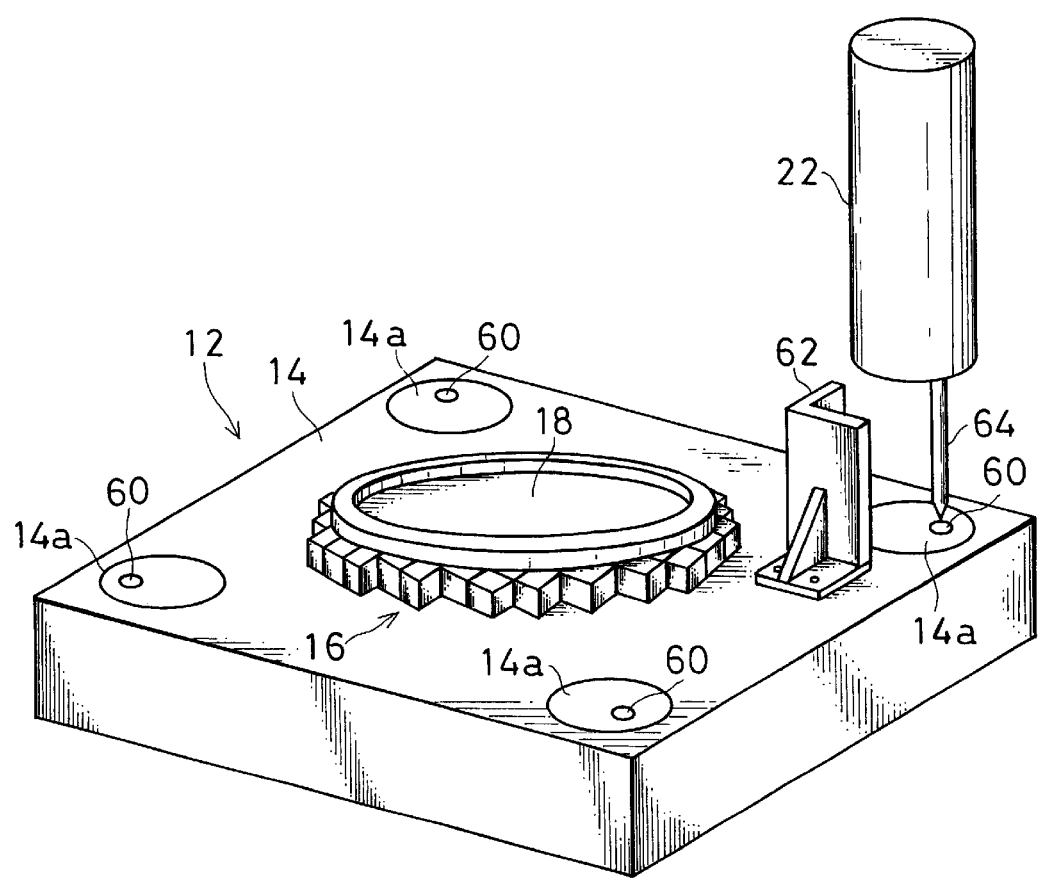

F I G. 12
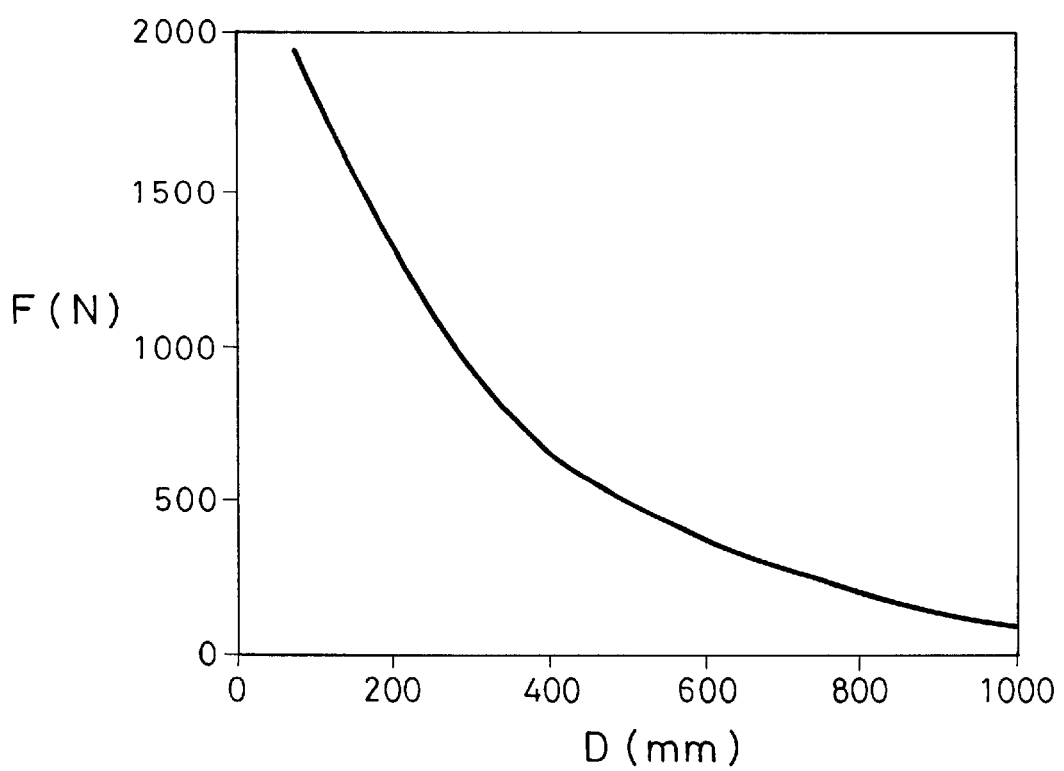

MAGNETIC FIELD GENERATOR FOR MRI, METHOD FOR ASSEMBLING THE SAME, AND METHOD FOR ASSEMBLING A MAGNET UNIT FOR THE SAME

BACKGROUND OF THE INVENTION

1. Field of the Invention

This invention relates to a magnetic field generator for an MRI, a method for assembling the same, and a method for assembling a magnet unit for the same. More Specifically, this invention relates to a magnetic field generator for MRI incorporating permanent magnets, a method for assembling the same, and a method for assembling a magnet unit for the same.

2. Description of the Related Art

A magnetic field generator for MRI uses permanent magnets. The magnet used in such an apparatus have to be made up of a plurality of magnet blocks. It is very difficult to place material blocks first and then magnetize each. Thus, in actual manufacturing, the magnetized blocks must be aligned on a plate yoke so that each of the magnet blocks has a same magnetic pole facing upward.

Conventionally, when placing the magnet blocks on the plate yoke, a surface of the plate yoke is first applied with adhesive, and then magnet blocks are bonded to the surface, as disclosed in the Japanese Patent No. 2,699,250 for example.

According to such a bonding method, upper surfaces of respective magnet blocks bonded to the plate yoke surface are not flush with each other, making an uneven surface. A magnetic field generator incorporating the permanent magnets made of such magnet blocks is apt to produce ununiform magnetic field between a pair of piece poles opposed to each other. Further, pole pieces for correcting the ununiformity of the magnetic field may be tilted to produce ununiformity in the magnetic field. Generally, after a step of mounting a pair of permanent magnets to oppose each other, a step of adjustment for uniformly distributing the magnetic field is indispensable. However, if the magnet blocks are mounted according to the above method, the ununiformity of the magnetic field is so large that the adjustment becomes very time consuming with a lot of sub-steps.

Further, according to the above method of bonding the magnet blocks, the magnet blocks each having a very intense magnetism have to be placed from above, onto the upper surface of the plate yoke, making extremely difficult to fit each of the magnet blocks snugly to adjacent magnet blocks. More specifically, when mounting, each magnet block is held with a face of predetermined magnetic pole facing upward. When the magnet block is brought above the other magnet block which is already fixed onto the plate yoke, a pulling force is generated between the two. Further, when the two magnet blocks are brought in adjacency, a repelling force is generated between the two. Since the magnet block to be placed is under such intense forces, the magnet block must be firmly held for safety while being transported. For a conventional holding mechanism, it is very difficult to fit the magnet block snugly to the place of bonding efficiently against these strong forces.

A pair of magnet units thus assembled as above are then opposed to each other so the permanent magnets are faced at a predetermined distance. This process is achieved by first assembling one magnet unit, then connecting a column yoke to the magnet unit, and finally connecting the other magnet unit to the column yoke.

The column yoke is to magnetically connect the pair of magnet units, and therefore must be made of a magnetic material. Thus, when the column yoke is connected to the magnet unit, the column yoke is brought under the pulling force from the magnet unit, making difficult to connect the two at a high accuracy. Likewise, when the second magnetic unit is connected to the column yoke already connected to the first magnet unit, it is also difficult to connect the two at a high accuracy.

SUMMARY OF THE INVENTION

It is therefore a primary object of this invention to provide a magnetic field generator for MRI, a method for assembling the same, and a method for assembling the magnet unit for the same for assembling the magnetic field generator at a high efficiency through easier assembling operation of the magnet unit, easier connecting operation and other assembling operations of the magnet unit and the column yoke.

The method for assembling a magnet unit according to this invention is a method for assembling a magnet unit by bonding magnet blocks to a bonding object provided in a surface of a plate yoke, comprising: an applying step in which adhesive is applied to at least a side surface of the bonding object or a side surface of the magnet block; a transporting step in which the magnet block is transported by sliding on the plate yoke; and a bonding step in which the transported magnet block is bonded to the bonding object.

It should be noted here that the term bonding object as used here in this document refers to an object to which a new magnet block is bonded in the surface of plate yoke. For example, the bonding object may be a projection provided in the surface of plate yoke, or may be a magnet block already fixed in the surface of plate yoke.

According to the above method, the magnet block is transported by sliding to fit the bonding object, i.e. the projection or another magnet block. Then, the magnet block is held press-fitted for a predetermined amount of time to complete the bonding to a predetermined location. Since the magnet blocks are mutually connected side by side, and therefore it is not necessary to apply adhesive to the surface of plate yoke, the upper surface of the resulting permanent magnet is not likely to be uneven. Further, transportation of the magnet block to the predetermined position can be achieved simply by sliding on the plate yoke, making possible to assemble the permanent magnet stably and efficiently. A note should be made here that in order to avoid a short circuit of the magnetic flux the projection should be made of non-magnetic material such as aluminum.

Before the magnet block is transported, a first guiding member is disposed in the surface of plate yoke. Positioning of the magnet block for fixation is achieved by bringing this magnet block into contact with a side surface of the first guiding member. By this operation the magnet block is accurately placed to the predetermined position. The first guiding member may be a pair of rails laid at 90-degree angle from each other.

Preferably, a recess should be formed at a place on a side surface of the first guiding member where two blocks are bonded to each other. The first guiding member must be removed after the permanent magnet has been assembled. The recess provided in the first guiding member effectively prevents, when the magnet blocks are bonded by adhesive, the adhesive squeezed out of the mating surfaces from sticking to the first guiding member, thereby preventing the magnet blocks from being bonded to the first guiding member.

For easy positioning, a new magnet block is fitted to a corner portion formed by side surfaces of a plurality of bonding objects provided on the plate yoke, i.e. a corner portion formed by side surfaces of a pair of adjacent magnet blocks already fixed on the plate yoke, or a corner portion formed by a side surface of the projection and a side surface of the magnet block fixed directly to the projection. Especially, the placement of the magnet blocks can be achieved without misalignment if the new magnet block is transported so that a side surface of the new magnet block is held parallel to one of the side surfaces of the corner portion, i.e. the side surface of the existing magnet block or the side surface of the projection.

Likewise, when the first guiding member is used, a new magnet block is fitted to a corner portion made by the side surface of the first guiding member and the side surface of the bonding object, i.e. a corner portion formed by the side surface of the first guiding member and a side surface of the projection, or a corner portion formed by the side surface of the first guiding member and a side surface of the magnet block fitted directly thereto, for easy positioning. Especially, the placement of the magnet blocks can be achieved without misalignment if the new magnet block is transported so that a side surface of the new magnet block is held parallel to one of the side surfaces of the corner portion, i.e. the side surface of the first guiding member or the side surface of the projection.

The other method for assembling the magnet unit according to this invention is a method for assembling a magnet unit by disposing a plurality of magnet blocks with a same magnetic pole facing upward in a surface of a plate yoke, comprising steps of: disposing a magnetic member above the plate yoke at a predetermined distance from the plate yoke generally in parallel thereto; and transporting each of the plurality of magnet blocks on the plate yoke, and fixing each of the plurality of magnet blocks to adjacent magnet blocks by bonding.

When a plurality of magnet blocks are disposed with a same magnetic pole facing in a same direction as described above, the magnet blocks are apt to be demagnetized by a reverse magnetic field acting on each of the magnet blocks. To avoid this problem, when the magnet blocks are placed, a pole piece as a magnetic member is disposed above the magnet blocks. This arrangement allows the pole piece to draw the magnetic flux, reducing the reverse magnetic field, thereby preventing demagnetization of the magnet block.

Further, if the pole piece is disposed as described above, it becomes possible to accurately dispose the pole piece at a predetermined position simply by lowering the pole piece onto the permanent magnet after the magnet blocks have been fixed. The pole piece, which is a large magnetic member exerting a very strong pulling force, can be very dangerous to the safety of operation as well as very difficult to accurately position to a predetermined location if brought close to the permanent magnet after the permanent magnet has been assembled. On the other hand, if the pole piece is disposed above the plate yoke in advance, the operational safety is assured as well as accurate positioning to the predetermined place becomes possible.

The method for assembling a magnetic field generator for MRI according to this invention is a method for assembling a magnetic field generator for MRI comprising: a pair of magnet units each including a plate yoke and a permanent magnet formed in a surface of the plate yoke; and a column yoke supporting and magnetically connecting the pair of magnet units, with one of the surfaces formed with the permanent magnet opposed to the other. The method comprises steps of: disposing a second guiding member for guiding the column yoke, between the permanent magnet on the plate yoke and a location where the column yoke is to be disposed on the plate yoke; lifting the column yoke above the magnet unit; and disposing the lifted column yoke onto the magnet unit by lowering the lifted column yoke along a side surface of the second guiding member.

Preferably, after disposing the second guiding member between the permanent magnet on the plate yoke and a hole where the column yoke is to be disposed in the plate yoke for guiding the guiding rod of lifted column yoke to the hole, the positioning of the column yoke is achieved by lowering the column yoke along the side surface of the second guiding member. The step can be performed more efficiently if the side surface of the second guiding member facing the hole is formed to generally fit the side surface of the column yoke as properly positioned for example. When having lifted, the column yoke is tilted to the vertical axis due to the pulling force exerted by the permanent magnet. By bringing the column yoke into contact with the guiding surface of the second guiding member, the column yoke can be lowered easily onto the predetermined position. The second guiding member should preferably have a height not smaller than 700 mm.

Another method for assembling a magnetic field generator for MRI according to this invention is a method for assembling a magnetic field generator for MRI comprising: a pair of magnet units each including a plate yoke and a permanent magnet formed in a surface of the plate yoke; and a column yoke supporting and magnetically connecting the pair of magnet units, with one of the surfaces formed with the permanent magnet opposed to the other. The magnet unit has an upper surface formed with a hole. The method comprises steps of: lifting the column yoke above the hole; attaching a guiding rod for insertion into the hole, to a lower end face of the column yoke; and connecting the column yoke and the magnet unit through guided lowering of the column yoke by inserting the guiding rod into the hole.

According to this method, the column yoke can be disposed to a predetermined position at a high accuracy by guiding the guiding rod into the hole while the lifted column yoke is being lowered.

Still another method for assembling a magnetic field generator for MRI according to this invention is a method for assembling a magnetic field generator for MRI such as described above. One of the magnet units above the other has a hole opening at a position where the column yoke is to be connected. The method comprises steps of: disposing the column yoke on an upper surface of the lower magnet unit; attaching a guiding rod to an upper end face of the column yoke; lifting the upper magnet unit above the column yoke; and connecting the upper magnet unit and the column yoke through guided lowering of the upper magnet unit by inserting the guiding rod into the hole.

According to this method, when the upper magnet unit is mounted onto the column yoke which is already fixed to the lower magnet unit, the upper magnet unit is lifted above the column yoke, with the permanent magnet faced downward, and then the upper magnet unit is lowered and disposed on the column yoke while being guided so that the guiding rod is inserted into the hole.

During the above step, if a pair of guiding rods each having a length differing from the other are used, a preliminary positioning between the column yoke and the magnet unit can be achieved by first inserting one guiding rod into the corresponding hole, and then a more accurate positioning can be achieved by inserting the other guiding rod into the corresponding hole.

The magnetic field generator for MRI according to this invention comprises: a pair of magnet units each including a plate yoke and a permanent magnet made of a plurality of magnet blocks disposed in a surface of the plate yoke; and a column yoke supporting and magnetically connecting the pair of magnet units, with one of the surfaces formed with the permanent magnet opposed to the other. The surface of the plate yoke formed with the permanent magnet is formed with a projection, and the magnet block is bonded side by side with the adjacent magnet block or the projection. Preferably, the projection is made of nonmagnetic material.

According to this invention, the permanent magnet used for the magnetic field generator for MRI can be assembled efficiently. Further, the magnet unit and the column yoke can be assembled efficiently and accurately. As a result, the magnetic field generator for MRI can be assembled efficiently.

The above described objects and other objects, features, aspects and advantages of this invention will become more apparent from the following detailed description of embodiments when taken in conjunction with the accompanying drawings.

BRIEF DESCRIPTION OF THE DRAWINGS

FIG. 1 is a perspective view of a magnetic field generator for MRI as an embodiment of this invention, with a partial cutaway.

FIG. 2 is a perspective view of a plate yoke before magnet blocks are mounted in a step of assembling the magnetic field generator for MRI as the embodiment of this invention.

FIG. 10 is a perspective view of a step of assembling a magnetic field generator for MRI as another embodiment of this invention, showing a state when a column yoke is being connected to a magnet unit.

FIG. 12 is a graph showing a relationship between the height of bottom surface of the column yoke and the pulling force of the permanent magnet acting on the column yoke in the above step of assembling.

DETAILED DESCRIPTION OF THE PREFERRED EMBODIMENTS

Figure 3:
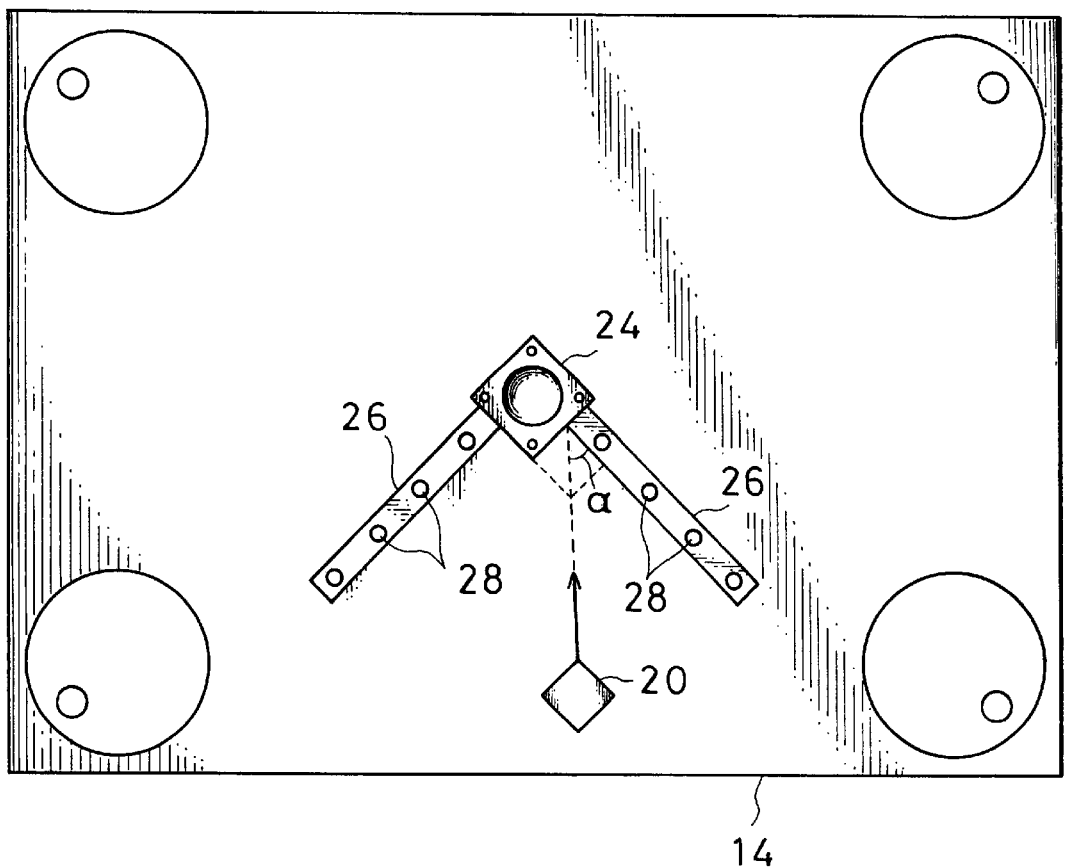
FIG. 3 is a plan view of the plate yoke showing a magnet block being assembled on the plate yoke in a step of the assembling.

Now, preferred embodiments of this invention will be described with reference to the accompanying drawings.

Referring first to FIG. 1, a magnetic field generator for MRI 10 as an embodiment of this invention comprises a pair of magnets units 12, 12a. Each of the magnet units 12, 12a includes a plate yoke 14. Each of the plate yokes 14 has a surface opposed to the other plate yoke, and this surface is provided with a permanent magnet 16, on which a pole piece 18 is provided. Each of the permanent magnets 16 includes a plurality of magnet blocks 20. Each of the magnet blocks 20 of the magnet unit 12 is fitted with adjacent ones, with a same magnetic pole facing upward. On the other hand, each of the magnet blocks 20 of the magnet unit 12a is fitted with adjacent ones, with the other magnetic pole facing downward. In other words, the permanent magnet 16 of the magnet unit 12 and the permanent magnet 16 of the magnet unit 12a are faced to each other so that different magnetic poles are opposed to each other.

The magnet blocks 20 may be a magnet made from a ternary system compound Nd—Fe—B composed mainly of neodynium (Nd), iron (Fe) and boron (B). Alternatively, part of Nd of the Nd—Fe—B may be replaced by dysprosium (Dy) while part of the Fe may be replaced by cobalt (Co). The Nd—Fe—B is known as a strong neodynium magnetic material with a maximum energy product of over 320 kJ/m³. It should be noted here that a method for making a rare earth magnet is disclosed in detail for example in the U.S. Pat. No. 4,770,723 specification.

The pair of opposed magnet units 12, 12a are supported and magnetically connected by four column yokes 22 having a circular cross-section, with a predetermined space in between, for example 40 cm to 60 cm. With such a structure, the magnetic field generator 10 is to form an uniform magnetic field in a space between the pair of pole pieces 18.

Now, for the above magnetic field generator 10, description will be made as to a method for assembling the permanent magnet 16 by placing a plurality of magnet blocks 20 in a generally disc pattern on an upper surface of the plate yoke 14.

Each of the magnet blocks 20 used in this embodiment includes a plurality (eight, for example) of magnet members. The magnet member is made by pressing and sintering magnetic powder into a general cube having the side of 4 cm to 10 cm. Then the plurality of magnet members are bonded with each other and magnetized.

As shown in FIGS. 2 and 3, the surface of the plate yoke 14 is provided in advance with a fixed projection 24 made of non-magnetic material such as aluminum as a guide. Further, the surface of the plate yoke 14 is provided with a pair of non-magnetic guide rails 26 each extending radially from the projection 24 at an angle of 90 degrees from each other. The guide rails 26 are detachably fixed to the plate yoke 14 by screws.

Figure 4A:
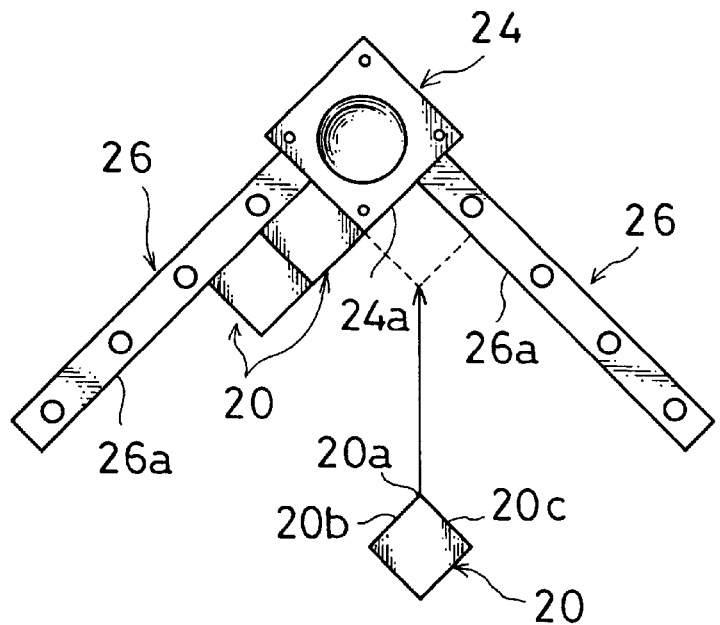
FIGS. 4(a) and 4(b) are a plan view of a magnet block being transported when the magnet block is assembled on the plate yoke in a step of the assembling.

As shown in FIG. 3, a first magnet block 20 is transported on the plate yoke 14 along a straight line equally dividing an angle between the projection 24 and one of the guide rails 26, i.e. the line making a 45-degree angle a shown in FIG. 3, and is disposed at a position shown by broken lines in FIG. 3. The magnet block 20 is transported by sliding while being magnetically fitted to the plate yoke 14. When the magnet block 20 being moved comes within a predetermined distance (e.g. 5 cm to 10 cm) from the projection 24, the transportation is stopped, and adhesive (e.g. an acrylic adhesive) is applied to a surface of the projection 24 to be fitted by the magnet block 20. However, the adhesive is not applied to a side surface of the guide rail 26. Then, transportation is resumed to press the magnet block 20 to the projection 24 to achieve the bonding. The magnet block 20 is held pressed against the projection 24 for a predetermined amount of time so that the adhesive become hardened to bond the two members. It should be noted here that for better positioning accuracy of the magnet block 20, the magnet block 20 should be transported as shown in FIG. 4(a), with an angled corner 20a facing ahead so that side surfaces 20b, 20c are respectively parallel to a mating side surface 24a of the projection 24 and another mating side surface 26a of the guide rail 26.

Figure 4B:
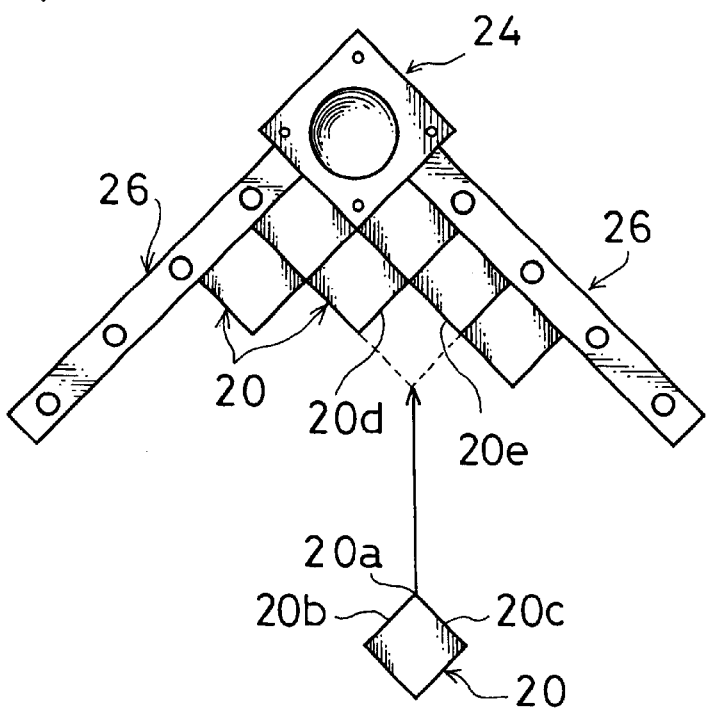
Figure 5:
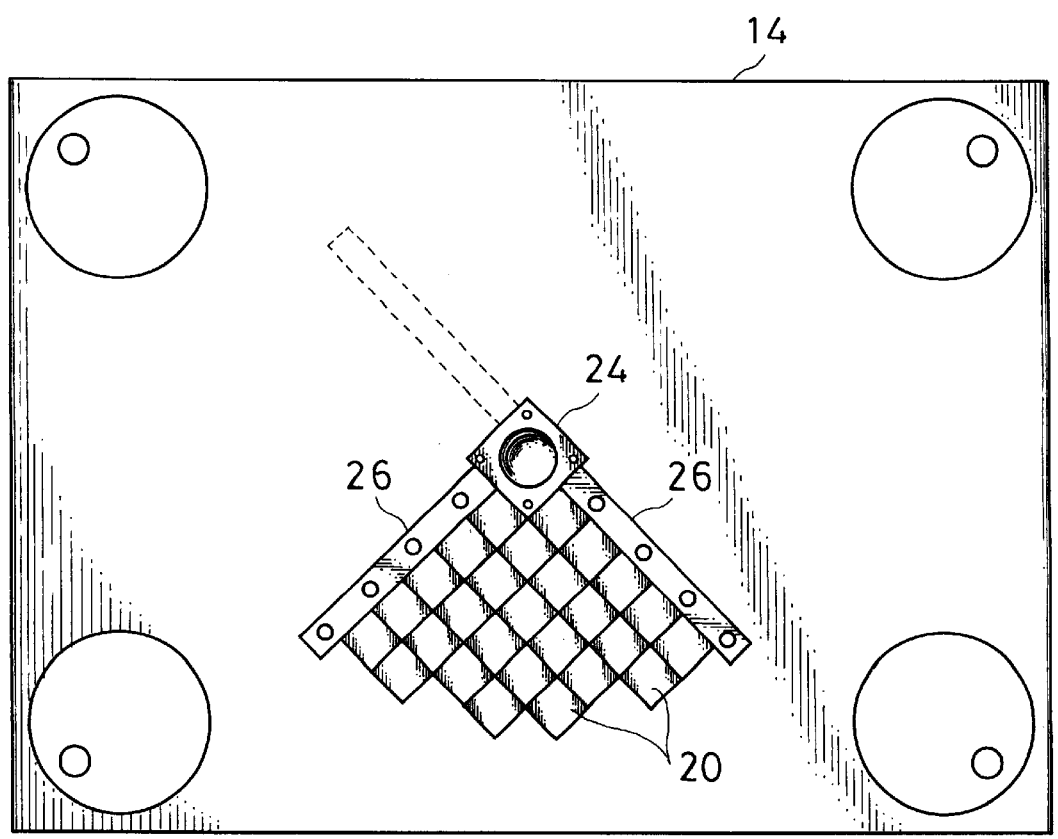
FIG. 5 is a plan view of the magnet blocks assembled in a quadrantal pattern on the plate yoke in a step of the assembling.

The projection 24, bonded by the magnet block 20, remains as part of the apparatus after the assembling is complete. However, since the projection 24 is non-magnetic, magnetic flux is not short-circuited. Thus, the fixation of the magnet blocks 20 can be completed without reducing the intensity of magnetic field generated between the magnet units 12 and 12a after the assembling. Further, use of aluminum for the projection 24 advantageously enhances the bonding by acrylic adhesives. Following the above step, a similar cycle of steps are repeated for transporting and fixing other magnet blocks 20 respectively to a corner portion made by the projection 24 and the other guide rail 26, a corner portion made by the side surface 26a of the guide rail 26 and a side surface of the previous magnet block 20, and a corner portion made by side surfaces 20d and 20e of a pair of mutually adjacent magnet blocks 20. Again, in these particular steps, as shown in FIG. 4(b), each of the magnet blocks 20 is transported with the side surfaces 20b, 20c held parallel to respective side surfaces which make the mating corner portion. Through the above steps, as shown in FIG. 5, the magnet blocks 20 are placed within a quadrant made by the pair of guide rails 26 as the radii. In each case, the corresponding side surface portion of the guide rails 26 is not applied with the adhesive, and only the corresponding side surface of the magnet block 20 is applied with the adhesive.

When a first quadrant has been covered by the magnet blocks 20, one of the fixed guide rails 26 (i.e. the right rail in FIG. 5) is removed and fixed to a position shown by the broken lines in FIG. 5. Then, the same cycle of steps as described above is repeated to place the magnet blocks 20 again in the quadrantal pattern fitted to the existing quadrantal pattern of the magnet blocks 20.

Likewise, the above set of steps is repeated for filling each quadrant with the magnet blocks 20, to assemble the permanent magnet 16 into a generally disc shape.

It should be noted here that as has been understood from the above description, the plate yoke 14 and the magnet blocks 20 are not directly bonded together. However, the magnet blocks 20 surrounding the projection 24 are bonded to the projection 24, whereas any adjacent pair of magnet blocks 20 are bonded to each other by the side surfaces. Further, each magnet block 20 strongly pulls the plate yoke 14. Thus, all the magnet blocks 20 will be in proper alignment after the assembling is complete.

Figure 6:
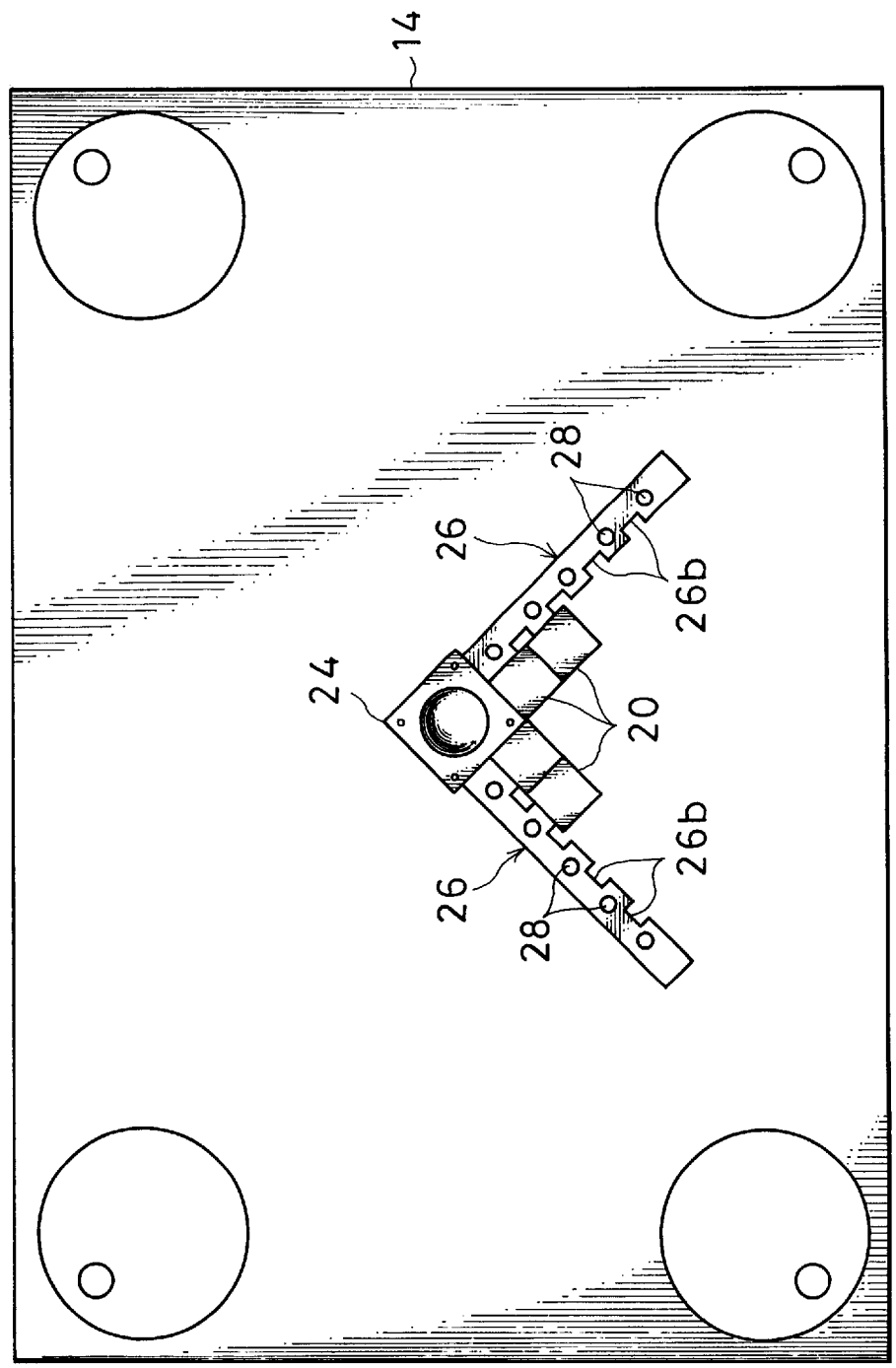
FIG. 6 is a plan view of the plate yoke showing another example of assembling the magnet blocks on the plate yoke in the step of the assembling.

It should also be noted here that the adhesive used for fixing the magnet blocks 20 is very strong. Once the magnet block 20 is bonded to the guide rail 26, it becomes difficult to separate the two. For this reason, as shown in FIG. 6, recesses 26b are formed in the side surface of each of the guide rails 26. The recesses 26b are formed at places where two magnet blocks 20 meet on the side surface of the guide rail 26. With such an arrangement, when a new magnet block 20 is pressed against a magnet block 20 which is already fixed, even if the adhesive sandwiched between the mating surfaces is squeezed out, the adhesive does not reach the guide rail 26, preventing the magnet blocks 20 from being bonded to the guide rail 26.

The assembling of the permanent magnet 16 as has been described above is performed as follows by using an assembling device 30 for example shown in FIG. 7.

Figure 7:
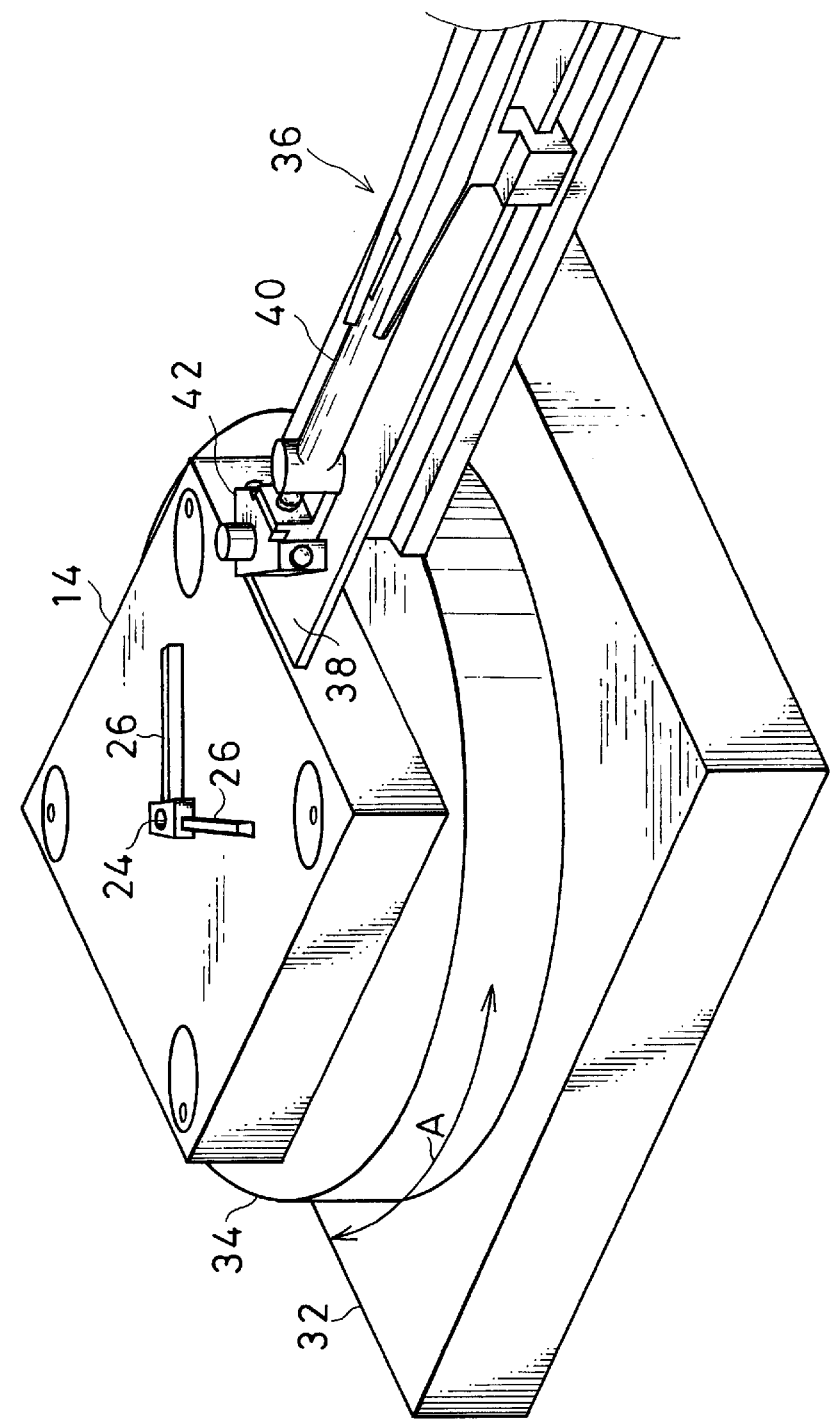
FIG. 7 is a perspective view showing a primary portion of a permanent magnet assembling device used in the embodiment in FIG. 1.

As shown in FIG. 7, the assembling device 30 includes a base 32. The base 32 has an upper surface provided with a turning table 34. The turning table 34 can turn in a direction shown by arrow A around a vertical turning shaft (not illustrated) at a center. The plate yoke 14 is mounted on the turning table 34.

The turning table 34 abuts on a transporting means 36. The transporting means 36 includes a transportation table 38. The transportation table 38 is held flush with the upper surface of the plate yoke 14 on the turning table 34. The transportation table 38 has an upper surface provided with an arm 40 having a forward end provided with a holding portion 42.

The transporting means 36 can move laterally, vertical to the axis of the arm 40. The arm 40 engages with the transportation table 38 so that the magnet block 20 held by the holding portion 42 is transported axially of the arm 40.

Figure 8:
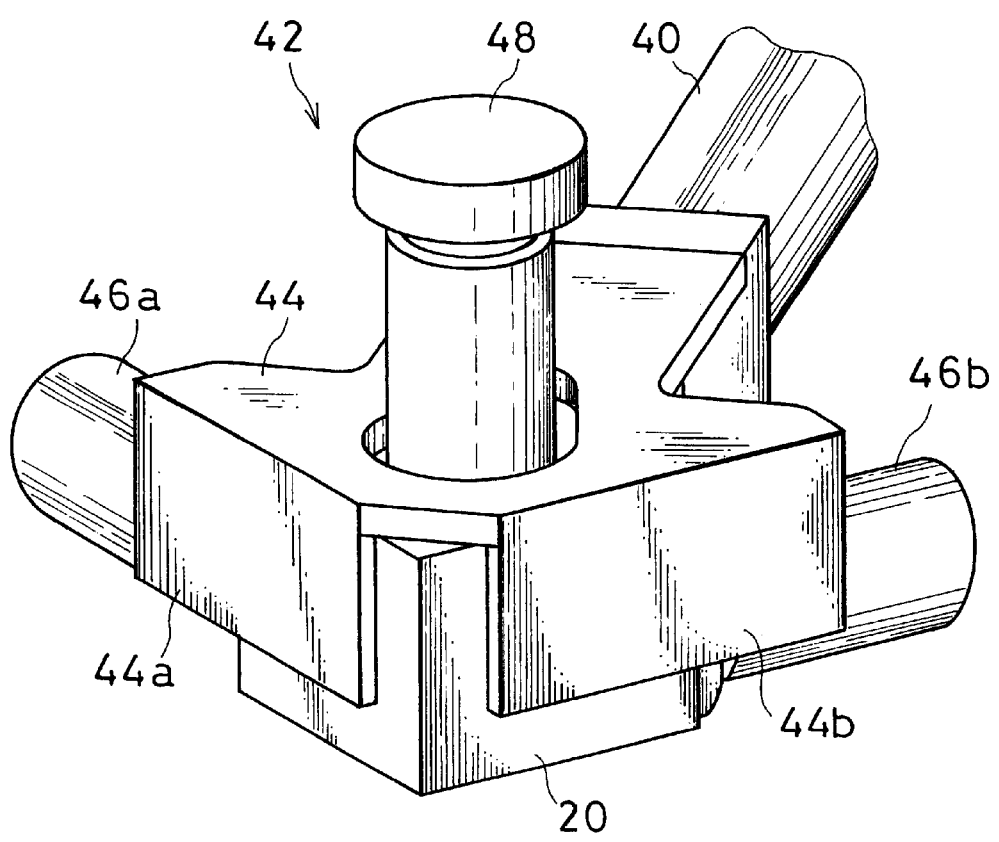
FIG. 8 is a perspective view of a magnet block holding portion of the assembling device in FIG. 7.

The holding portion 42 has a structure shown in FIG. 8. Specifically, the holding portion 42 includes a frame member 44 having a pair of side walls 44a, 44b, and a pair of side-pressing hydraulic cylinders 46a, 46b respectively face to the side walls 44a, 44b. The holding portion 42 has an upper surface provided with a downward-pressing hydraulic cylinder 48 for pressing the magnet block 20 held by the holding portion 42 in a downward direction. The frame member 44 can be raised by a hydraulic lifting-lowering cylinder (not illustrated).

The magnet block 20 is slid on the plate yoke 14 while being clamped by the side walls 44a, 44b of the frame member 44, and the side-pressing hydraulic cylinders 46a, 46b. When bonding the magnet block 20 to a magnet block 20 which is already bonded and so on, the magnet block 20 held in the transporting means 36 is pressed downwardly by the downward-pressing hydraulic cylinder 48. This prevents the magnet block 20 from being floated by the repelling force acting between the magnet block 20 itself and the fixed magnet block 20. Meanwhile the frame member 44 is raised to expose two bonding surfaces of the magnet block 20. When the adhesive has been applied to both (or only one) of the exposed surfaces of the magnet block 20, the magnet block 20 is pressed and bonded against mating surfaces by the side-pressing hydraulic cylinders 46a, 46b for a predetermined amount of time while the magnet block 20 is still being pressed downwardly by the downward-pressing hydraulic cylinder 48.

Figure 9:
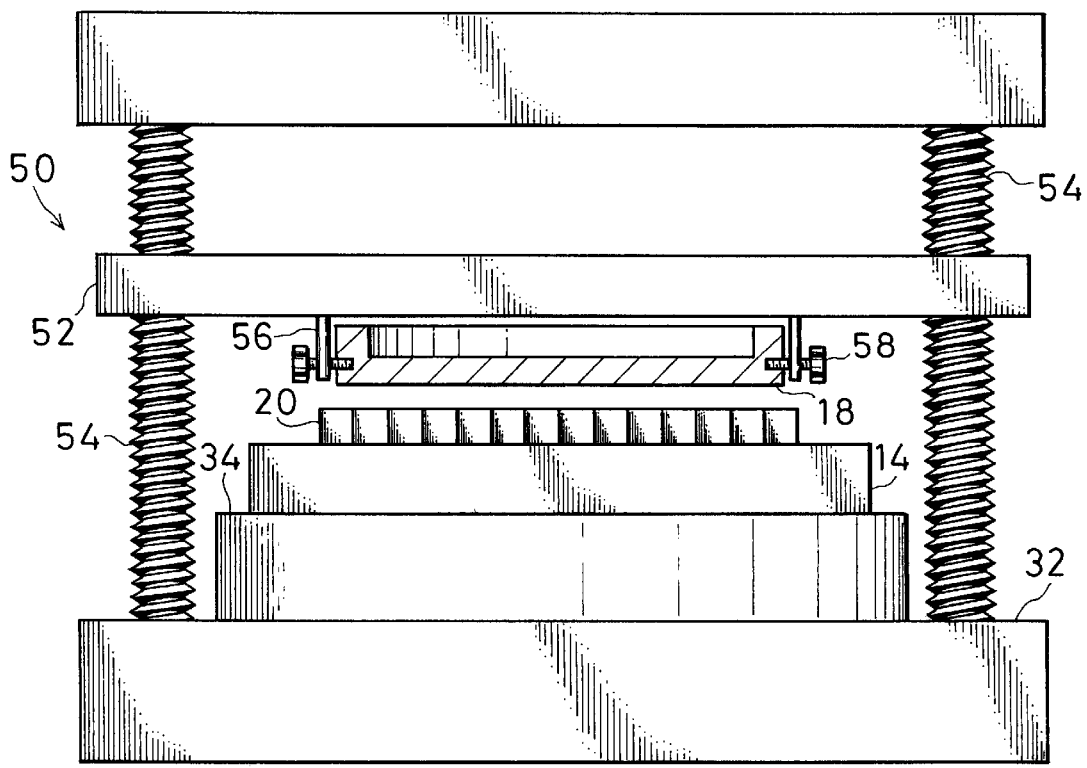
FIG. 9 is a front view, showing a primary portion of another permanent magnet assembling device used in the embodiment in FIG. 1.

While the above operations are performed, the pole piece 18 is kept above the plate yoke 14. The pole piece 18 is held above the plate yoke 14 by using a lift 50 shown in FIG. 9 for example. The lift 50 includes a lift base 52. The lift base 52 is vertically movable by turning threaded drive shafts 54. The lift base 52 has a lower surface provided with holding portions 56. The pole piece 18 is fixed to the holding portions 56 by bolts 58. The pole piece 18, which is mainly made of magnetic iron, draw magnetic flux generated by the magnet blocks 20 which are already bonded.

By providing the pole piece 18 above the plate yoke 14 as described above, the operating point of the permanent magnet 16 which is being assembled can be raised, reducing demagnitization of the magnet block 20 which is already fixed and of the magnet block 20 which is being bonded. Further, when the magnet block 20 held by the holding portion 42 is being bonded, an upper end of the downward-pressing hydraulic cylinder 48 may be pressed against a lower surface of the pole piece 18 held above, holding stably the magnet block 20.

Further, after completing the fixation of the magnet blocks 20, the pole piece 18 is then mounted to the permanent magnet 16 by simply lowering the pole piece 18 from the position where it has been held. On the other hand, it is extremely difficult to move the pole piece 18 onto the permanent magnet 16 from elsewhere after the magnet blocks 20 have been fixed. According to the present method, however, it becomes possible to easily mount the pole piece 18 onto the predetermined position.

Still further, when the magnet block 20 is bonded for example, the pole piece 18 is held approximately 5 cm above the upper surfaces of the magnet blocks 20. Meanwhile, the upper surface of the downward-pressing hydraulic cylinder 48 of the holding portion 42 is pressed against the lower surface of the pole piece 18. This operation effectively counterparts the repelling force acting between the magnet block 20 held by the holding portion 42 and the magnet blocks 20 already fixed to the plate yoke 14, making possible to easily fix the magnet block 20 onto a predetermined position on the plate yoke 14.

Now that the surfaces of the plate yokes 14 are covered by the permanent magnets 16 and mounted with pole pieces 18, description will be made as to a method of assembling the pair of magnet units 12, 12a with the column yokes 22 in between.

First, a column yoke 22 is disposed at each of four corner portions of the plate yoke 14 of the magnet unit 12 according to the following steps.

Specifically, in order to create an uniform magnetic field between the pair of pole pieces 18 by the completed magnetic field generator 10, the permanent magnets 16 must be away from the column yokes 22 by a certain distance. When the distance is large, the magnetic field formed between the pole pieces 18 will be more uniform. However, this will make the apparatus heavier. For this reason, in the magnetic field generator 10 designed for placing a whole body of human between the pole pieces 18, the distance between the permanent magnet 16 and the column yoke 22 is conventionally set to 100 mm~300 mm.

With such an arrangement as above, the column yoke 22 is lifted by a crane (not illustrated) for example and suspended with one of the end face pointing downward. The column yoke 22 is then lowered onto a connecting portion 14a (see FIG. 10) of the plate yoke 14.

There is a problem here. Specifically, since the column yoke 22 is magnetic, the column yoke 22 is pulled by the permanent magnet 16 when brought closer to the permanent magnet 16, and therefore it is difficult to dispose the column yoke 22 onto the predetermined position.

For this reason, as shown in FIG. 10, a guiding member 62 is provided between the permanent magnet 16 and a hole 60 on the plate yoke 14, for guiding the column yoke 22. This makes possible to place the column member 22 safely and efficiently. The guiding member 62 has a pair of side walls making a generally L-shaped section for example, and is placed so that these side walls will contact a side surface of the column yoke 22 as properly assembled. The column yoke 22 should be first lifted right above the point of fixation, i.e. above the connecting portion 14a, and then lowered right into the place of fixation. Thus, the height of the guiding member 62 is determined taking into account the intensity of the magnetic field of the permanent magnet 16, shape of the column yoke 22 and so on.

It should be noted here that as will be understood from the above description, the guiding member 62 must be placed closely to the permanent magnet 16, and therefore should be made of a non-magnetic material such as aluminum. However, when the column yoke 22 is being placed, the intense pulling force acting on the column yoke 22 exerted by the permanent magnet 16 makes the column yoke 22 contact and seriously wear off or deform the aluminum guiding member 62. For this reason, the guiding member 62 is made of aluminum but clad by stainless steel for example.

Further, as shown in FIG. 10, a guiding rod 64 is attached to the lower end face of the column yoke 22 to be placed, whereas the connecting portion 14a of the plate yoke 14 is formed with a matching hole 60 for receiving the guiding rod 64. This makes possible to place the column yoke 22 into the connecting portion 14a easily and accurately. The guiding rod 64 is detachably mounted to the column yoke 22. The guiding rod 64 is made longer than the thickness of the plate yoke 14 so that the guiding rod 64 can be easily removed from the column yoke 22 after the column yoke 22 is positioned to the connecting portion 14a.

With the above arrangement, the column yoke 22 is lifted by a crane for example, so that the end face attached with the guiding rod 64 is pointing downward vertically. The column yoke 22 is then lowered while the guiding rod 64 is inserted into the hole 60 so that the column yoke 22 is positioned right on the connecting portion 14a. After the column yoke 22 has been properly positioned, the guiding rod 64 is removed from the lower end face of the plate yoke 14, and the column yoke 22 is fixed to the plate yoke 14 by bolts (not illustrated) for example.

The guiding rod 64 and the guiding member 62 as described above can be used independently from each other. However, use of both as shown in FIG. 10 can further facilitate operability in the assembling step.

It should be noted here that in an actual assembling, the guiding rod 64 is guided into the hole 60 manually by human while the column yoke 22 is being lowered. Thus, if the pulling force from the permanent magnet 16 to the column yoke 22 is very strong, positioning the column yoke 22 can be very difficult, significantly deteriorating operability.

Figure 11:
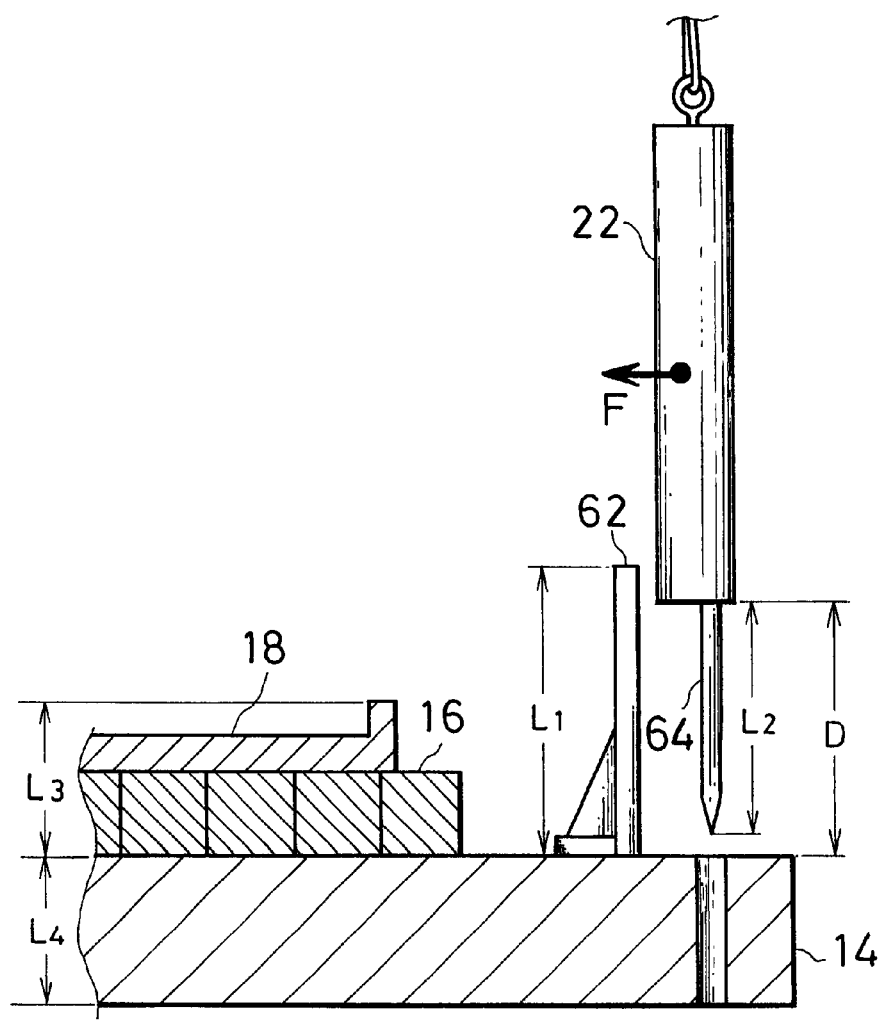
FIG. 11 is a perspective view of a primary portion, showing the above step of assembling.

The height of the guiding member 62 shown as $L_1$ in FIG. 11 must be larger than a height $L_3$ of the pole piece 18, as evident from the purpose it serves. According to the magnetic field generator 10 of this particular embodiment, the length $L_2$ of the guiding rod 64 is 500 mm, $L_3$ is 300 mm, whereas the thickness $L_4$ of the plate yoke 14 is 300 mm.

FIG. 12 shows a relationship between the height D of the lower end face of the column yoke 22 held above the connecting portion 14a and the pulling force F of the permanent magnet 16 acting on the column yoke 22. The magnetic flux density near the permanent magnet 16 is 0.1 tesla~0.2 tesla. Thus, as understood from the FIG. 12, with $L_1$ being 300 mm, the column yoke 22 being lowered can be under a pulling force of nearly 1000 N. When the column yoke 22 is lowered, in order for the suspended column yoke 22 to be manually guided onto the predetermined position without being excessively pulled by the permanent magnet 16, the pulling force from the permanent magnet 16 to the column yoke 22 must be controlled to approximately 200 N~300 N, which means the height $L_1$ must be greater than 300 mm. Judging from FIG. 12, a preferable height $L_1$ of the guiding member 62 is 700 mm or greater.

With the height $L_1$ selected as above, the column yoke 22 can be guided manually to the predetermined position, thus the operability is improved.

After the column yokes 22 are connected to the magnet unit 12, the other magnet unit 12a is connected to the other ends of the column yokes 22 to form a magnetic circuit. For this operation, the magnet unit 12a to be connected is held with its pole piece 18 facing downward, above the column yokes 22 already assembled to the magnet unit 12.

Figure 13:
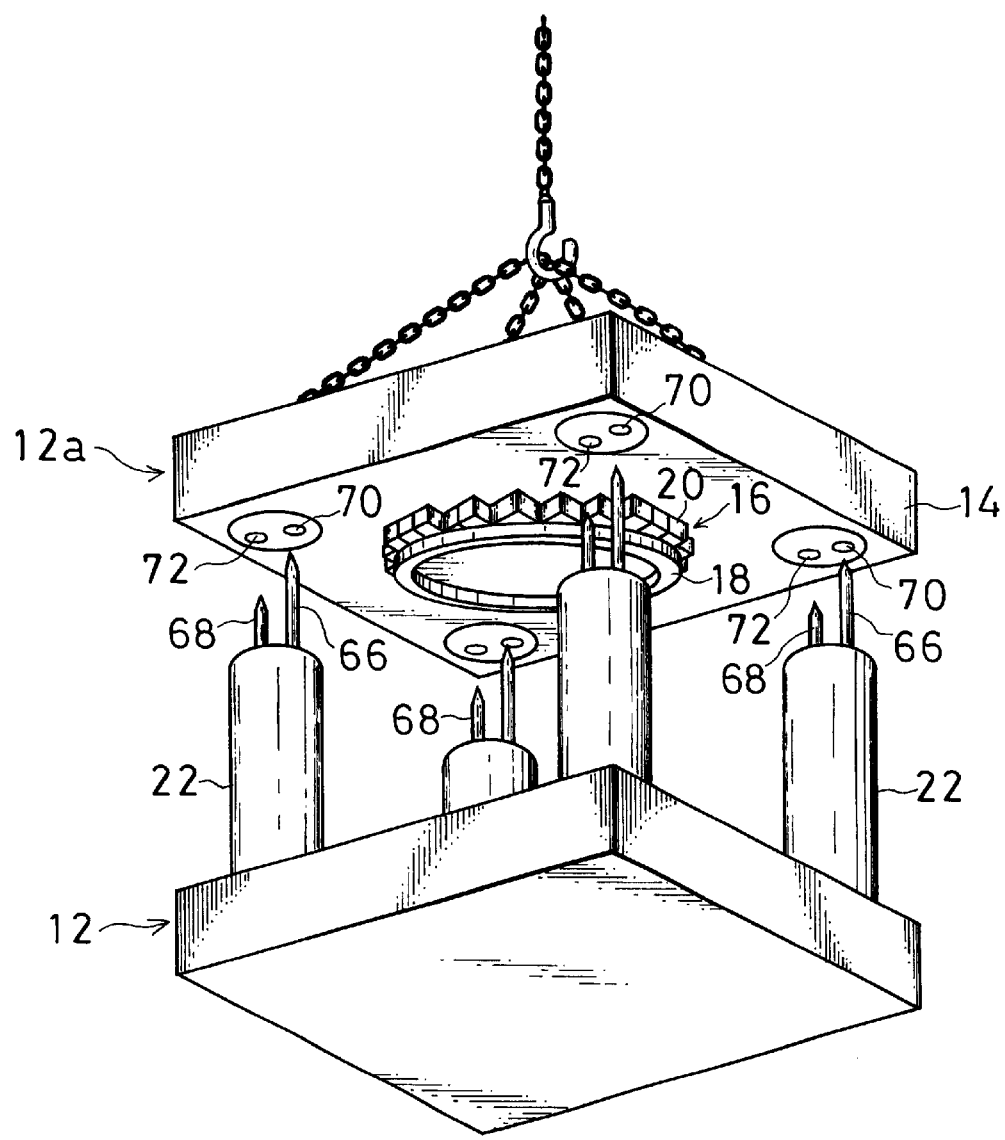
FIG. 13 is a perspective view of a state when the other magnet unit is being connected to the column yokes in a step of the assembling.

As shown in FIG. 13, a first guiding rod 66 and a second guiding rod 68 are detachably mounted to the end face of the column yoke 22. Further, matching holes 70, 72 are formed in advance at each of the four corner portions of the plate yoke 14 of the magnet unit 12a respectively for guiding the first and second guiding rods 66, 68. It should be noted here that the first guiding rod 66 is made longer than the second guiding rod 68. Specifically, when the lifted magnet unit 12a is lowered by a crane for example, the hole 70 is guided to the first guiding rod 66 of the column yoke 22 as a preliminary alignment of the magnet unit 12a to the column yokes 22. Next, the magnet unit 12a is lowered further to guide the second guiding rod 68 into the hole 72 to complete the placement of the magnet unit 12a onto the column yokes 22. Though not illustrated here, a guiding member similar to the guiding member 62 used when the column yokes 22 are connected to the magnet unit 12 should be provided in the magnet unit 12a for more improved efficiency in the assembling operation.

Since the pair of magnet units 12, 12a are pulling each other, any relative misalignment between the two is difficult to be corrected afterwards. On the other hard, according to the method described above, it becomes possible to accurately place the magnet unit 12a. After the placement of the magnet unit 12a is complete, the guiding rods 66, 68 are removed from the upper face of the plate yoke 14, and each of the column yokes 22 is fixed to the magnet unit 12a by bolts or other fasteners.

Figure 14:
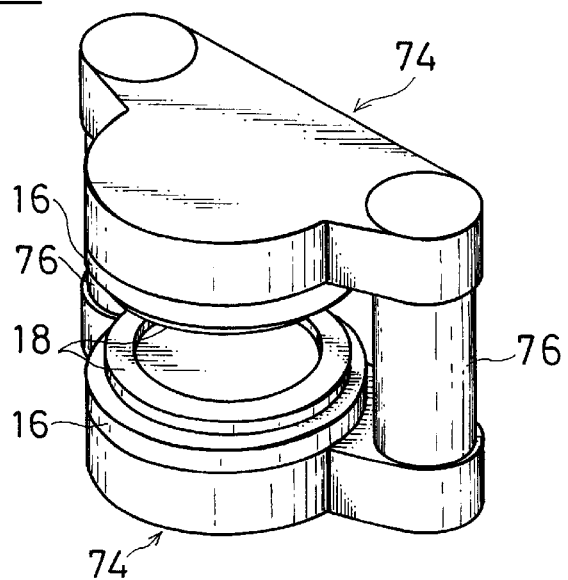
FIG. 14 is a perspective view of another embodiment of the magnetic field generator for MRI.
Figure 15:
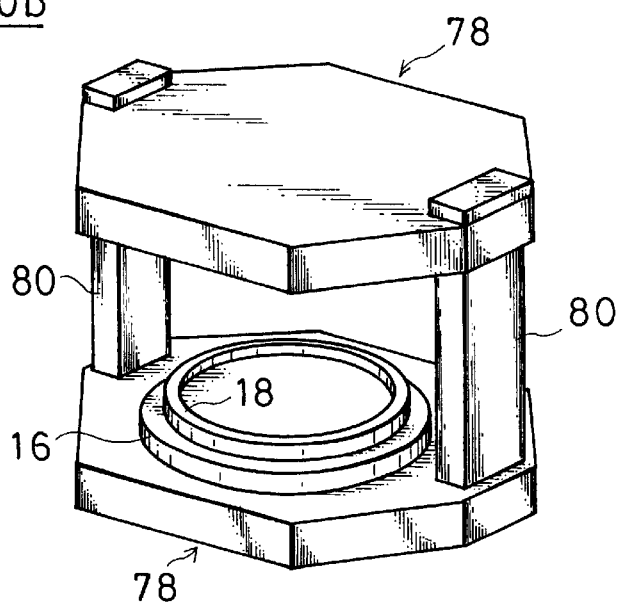
FIG. 15 is a perspective view of still another embodiment of the magnetic field generator for MRI.
Figure 16:
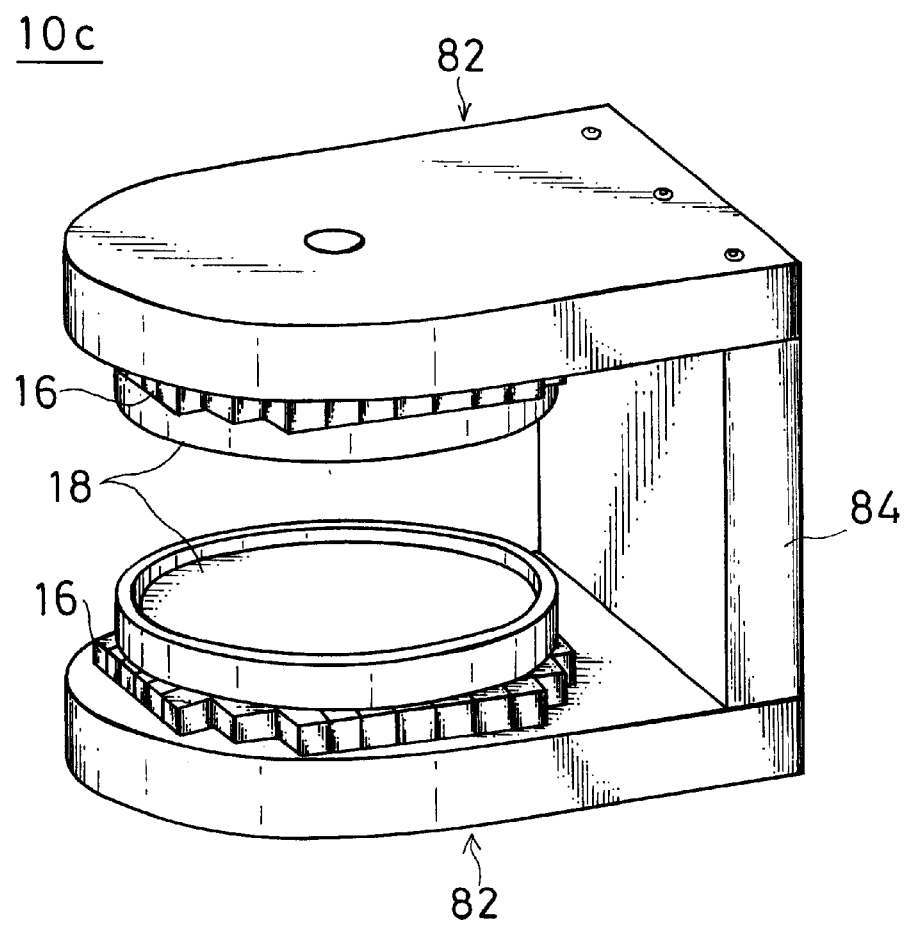
FIG. 16 is a perspective view of still another embodiment of the magnetic field generator for MRI.

It should be noted that this invention is also applicable to other magnetic field generators such as a magnetic field generator 10a shown in FIG. 14 which uses two column yokes 76 for connecting a pair of magnet units 74 each provided with a permanent magnet 16 and a pole piece 18; a magnetic field generator 10b shown in FIG. 15 which uses two column yokes 80 for connecting a pair of magnet units 78 each provided with a permanent magnet 16 and a pole piece 18; and further to a magnetic field generator 10c shown in FIG. 16 which uses one column yoke 84 for connecting a pair of magnet units 82. Although each of the permanent magnets 16 is illustrated as a solid disc in FIGS. 14 and 15, each is an assembled magnet in which a plurality of magnet blocks are assembled into a generally disc shape similarly to the permanent magnet 16 used in the magnetic field generator 10 according to the above embodiment.

It should be noted here that in the step of applying the adhesive, this invention is not limited to the case where the application of the adhesive is made to the side surfaces of the already fixed magnet blocks 20 on the plate yoke 14 and the side surface of the projection 24. The application of the adhesive may be made to side surfaces of the magnet block 20 to be mounted.

Although this invention has been described and illustrated in detail, it is clearly understood that the same is by way of illustration and example only and is not to be taken by way of limitation, the spirit and scope of this invention being limited only by the terms of the appended claims.

What is claimed is:

1. A method for assembling a magnet unit by bonding magnet blocks to a bonding object provided on a surface of a plate yoke, comprising:

an applying step in which adhesive is applied to at least one of a side surface of the bonding object and a side surface of the magnet block;

a transporting step in which the magnet block is transported by sliding on the plate yoke; and a bonding step in which the transported magnet block is bonded to the bonding object.

2. The method according to claim 1, wherein the transporting step includes a sub-step of transporting the magnet block to fit into a corner portion formed by side surfaces of a plurality of the magnet blocks.

3. The method according to claim 2, wherein the method further comprises a step of transporting the magnet block toward the corner portion, with the side surface of the magnet block held parallel to a side surface of the bonding object forming the corner portion.

4. The method according to claim 1, wherein the method further comprises a placing step in which a first guiding member is placed on the surface of the plate yoke; and wherein the transporting step includes a sub-step of positioning the magnet block by fitting the magnet block to a side surface of the first guiding member.

5. The method according to claim 4, wherein the transporting step includes a sub-step of transporting the magnet block to fit into a corner portion formed by the side surface of first guiding member and the side surface of the bonding object.

6. The method according to claim 5, wherein the method further comprises a step of transporting the magnet block toward the corner portion, with a side surface of the magnet block held parallel to the side surface of first guiding member forming the corner portion or the side surface of the bonding object forming the corner portion.

7. The method according to one of claims 4 to 6, wherein the first guiding member is provided with a recess, the recess being formed in the side surface of the first guiding member at a place where two magnet blocks are mutually bonded.

8. The method according to one of claims 1 to 6, wherein the bonding object includes at least one of a projection provided in the surface of the plate yoke and a magnet block already fixed in the surface of the plate yoke.

9. The method according to claim 8, wherein the projection is made of non-magnetic material.

10. A method for assembling a magnet unit by disposing a plurality of magnet blocks with a same magnetic pole facing upward in a surface of a plate yoke, comprising steps of:

disposing a magnetic member above the plate yoke at a predetermined distance from the plate yoke generally in parallel thereto; and transporting each of the plurality of magnet blocks on the plate yoke, and fixing each of the plurality of magnet blocks to adjacent magnet blocks by bonding.

11. The method according to claim 10, wherein the magnetic member is a pole piece, and the method further comprises a step of lowering the pole piece to place the pole piece onto the disposed magnet blocks after the step of fixing the magnet blocks.

* * * * *